(12) United States Patent
Kurita

(10) Patent No.: US 9,145,611 B2
(45) Date of Patent: Sep. 29, 2015

(54) LOAD LOCK CHAMBER WITH SLIT VALVE DOORS

(71) Applicant: Applied Materials, Inc., Santa Clara, CA (US)

(72) Inventor: Shinichi Kurita, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 175 days.

(21) Appl. No.: 14/015,326

(22) Filed: Aug. 30, 2013

(65) Prior Publication Data

US 2014/0072725 A1 Mar. 13, 2014

Related U.S. Application Data

(60) Provisional application No. 61/698,420, filed on Sep. 7, 2012.

(51) Int. Cl.
| | |
|---|---|
| C23C 16/52 | (2006.01) |
| C23C 16/54 | (2006.01) |
| H01J 37/32 | (2006.01) |
| H01L 21/67 | (2006.01) |

(52) U.S. Cl.
CPC ............... *C23C 16/52* (2013.01); *C23C 16/54* (2013.01); *H01J 37/32889* (2013.01); *H01J 37/32899* (2013.01); *H01L 21/67126* (2013.01); *H01L 21/67184* (2013.01); *H01L 21/67201* (2013.01)

(58) Field of Classification Search
CPC .. C23C 16/52; C23C 16/54; H01L 21/67126; H01L 21/67184; H01L 21/67201
USPC .............................................. 137/613
See application file for complete search history.

(56) References Cited

U.S. PATENT DOCUMENTS

| | | | |
|---|---|---|---|
| 5,961,269 A * | 10/1999 | Kroeker | ............ 414/221 |
| 6,048,154 A | 4/2000 | Wytman | |
| 7,105,463 B2 | 9/2006 | Kurita et al. | |
| 7,207,766 B2 | 4/2007 | Kurita et al. | |
| 7,695,232 B2 | 4/2010 | Moore et al. | |
| 2008/0044259 A1 | 2/2008 | Kurita et al. | |
| 2008/0087214 A1 | 4/2008 | Lee et al. | |
| 2008/0271675 A1 * | 11/2008 | Choi et al. | ............ 118/715 |
| 2010/0133255 A1 * | 6/2010 | Bahng et al. | ............ 219/444.1 |
| 2013/0224953 A1 * | 8/2013 | Salinas et al. | ............ 438/689 |

* cited by examiner

*Primary Examiner* — Kevin Lee
(74) *Attorney, Agent, or Firm* — Patterson & Sheridan, LLP

(57) ABSTRACT

The present invention generally provides a load lock chamber having slit valve doors. The load lock chamber is used to connect a transfer chamber to a factory interface, or to connect two transfer chambers. When the load lock chamber is between adjacent transfer chambers, the load lock chamber has slit valve doors within the load lock chamber which seal against an inside surface of the load lock chamber. The load lock can thus be serviced at atmospheric pressure without breaking vacuum in the transfer chambers because the atmospheric pressure presses the doors against the inside surface. When the load lock chamber is between a transfer chamber and a factory interface, one slit valve door is disposed outside of the load lock chamber and seals against an outside surface of the load lock chamber. The atmospheric pressure from the factory interface side helps press the door against the outside surface.

15 Claims, 4 Drawing Sheets

LOAD LOCK CHAMBER WITH SLIT VALVE DOORS

CROSS-REFERENCE TO RELATED APPLICATIONS

This application claims benefit of U.S. Provisional Patent Application Ser. No. 61/698,420, filed Sep. 7, 2012, which is herein incorporated by reference.

BACKGROUND OF THE INVENTION

1. Field of the Invention

Embodiments disclosed herein generally relate to a slit valve door for sealing an opening in a load lock chamber.

2. Description of the Related Art

Substrate throughput in semiconductor processing is always a challenge. If technology is to advance, semiconductor substrates continually need to be processed efficiently. Cluster tools have developed as an effective means for processing multiple substrates simultaneously without breaking vacuum. Instead of processing a single substrate and then exposing the substrate to atmosphere during transfer to another chamber, multiple process chambers can be connected to a common transfer chamber so that when a process is complete on the substrate in one process chamber, the substrate can be moved, while still under vacuum, to another process chamber that is coupled to the same transfer chamber.

Moreover, multiple transfer chambers each coupled with a plurality of processing chambers can be connected by load lock chambers to further increase efficiency. Additionally, load lock chambers may be used to connect a factory interface, which is at atmospheric pressure, to a transfer chamber, which is under vacuum.

Therefore, there is a need for load lock chambers that are able to interface between transfer chambers and between a transfer chamber and a factory interface.

SUMMARY OF THE INVENTION

The present invention generally provides a load lock chamber having slit valve doors. The load lock chamber is used to connect a transfer chamber to a factory interface, or to connect two transfer chambers. When the load lock chamber is between adjacent transfer chambers, the load lock chamber has slit valve doors within the load lock chamber which seal against an inside surface of the load lock chamber. The load lock can thus be serviced at atmospheric pressure without breaking vacuum in the transfer chambers because the atmospheric pressure presses the doors against the inside surface. When the load lock chamber is between a transfer chamber and a factory interface, one slit valve door is disposed outside of the load lock chamber and seals against an outside surface of the load lock chamber. The atmospheric pressure from the factory interface side helps press the door against the outside surface.

In one embodiment, an apparatus for forming a device is disclosed. The apparatus comprises a first load lock chamber, which comprises a chamber body having a first side adapted for coupling to a factory interface and a second side adapted for coupling to a first transfer chamber. A first slit valve door is disposed inside the chamber body at the first side below a substrate transfer plane, and a second slit valve door is disposed inside the chamber body at the second side below the substrate transfer plane. The first transfer chamber is coupled to the first load lock chamber, and a plurality of processing chambers is coupled to the first transfer chamber.

In another embodiment, a load lock chamber is disclosed. The load lock chamber comprises a chamber body having a first side adapted for coupling to a factory interface and a second side adapted for coupling to a transfer chamber. A first slit valve door is disposed inside the chamber body at the first side below a substrate transfer plane, and a second slit valve door is disposed inside the chamber body at the second side below the substrate transfer plane. A first actuator is coupled to the first slit valve door, wherein the first actuator opens the first slit valve door towards the outside of the chamber body. A second actuator is coupled to the second slit valve, wherein the second actuator opens the second slit valve door towards the inside of the chamber body.

In another embodiment, a load lock chamber is disclosed. The load lock chamber comprises a chamber body having a first side adapted for coupling to a first transfer chamber and a second side adapted for coupling to a second transfer chamber. A first slit valve door is disposed inside the chamber body at the first side below a substrate transfer plane and a second slit valve door is disposed inside the chamber body at the second side below the substrate transfer plane. A first actuator is coupled to the first slit valve door, wherein the first actuator opens the first slit valve door towards the inside of the chamber body. A second actuator is coupled to the second slit valve, wherein the second actuator opens the second slit valve door towards the inside of the chamber body.

In another embodiment, a method for processing substrates in the apparatus is disclosed. The method comprises the steps of loading substrates from a factory interface to a first load lock chamber through a first slit valve door disposed inside the first load lock chamber, wherein the first slit valve door opens toward the outside of the first load lock chamber, transferring substrates from the first load lock chamber to a first transfer chamber through a second slit valve door disposed inside the first load lock chamber, wherein the second slit valve door opens toward the inside of the first load lock chamber, transferring substrates from the first transfer chamber to processing chambers coupled to the first transfer chamber, processing substrates in the processing chambers, transferring substrates to the first transfer chamber after processing, transferring substrates from the first transfer chamber to a second load lock chamber through a third slit valve door disposed inside the second load lock chamber, wherein the third slit valve door opens toward the inside of the second load lock chamber, and transferring substrates from the second load lock chamber to a second transfer chamber through a fourth slit valve door disposed inside the second load lock chamber, wherein the fourth slit valve door opens toward the inside of the second load lock chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally provides a load lock chamber having slit valve doors. The load lock chamber is used to connect a transfer chamber to a factory interface, or to connect two transfer chambers. When the load lock chamber is between adjacent transfer chambers, the load lock chamber has slit valve doors within the load lock chamber which seal against an inside surface of the load lock chamber. The load lock can thus be serviced at atmospheric pressure without breaking vacuum in the transfer chambers because the atmospheric pressure presses the doors against the inside surface. When the load lock chamber is between a transfer chamber and a factory interface, one slit valve door is disposed outside of the load lock chamber and seals against an outside surface of the load lock chamber. The atmospheric pressure from the factory interface side helps press the door against the outside surface.

The invention is illustratively described below utilized in a processing system, such as those available from AKT America, a division of Applied Materials, Inc., Santa Clara, Calif. However, it should be understood that the invention has utility in other system configurations, including those sold by other manufacturers.

Figure 1:
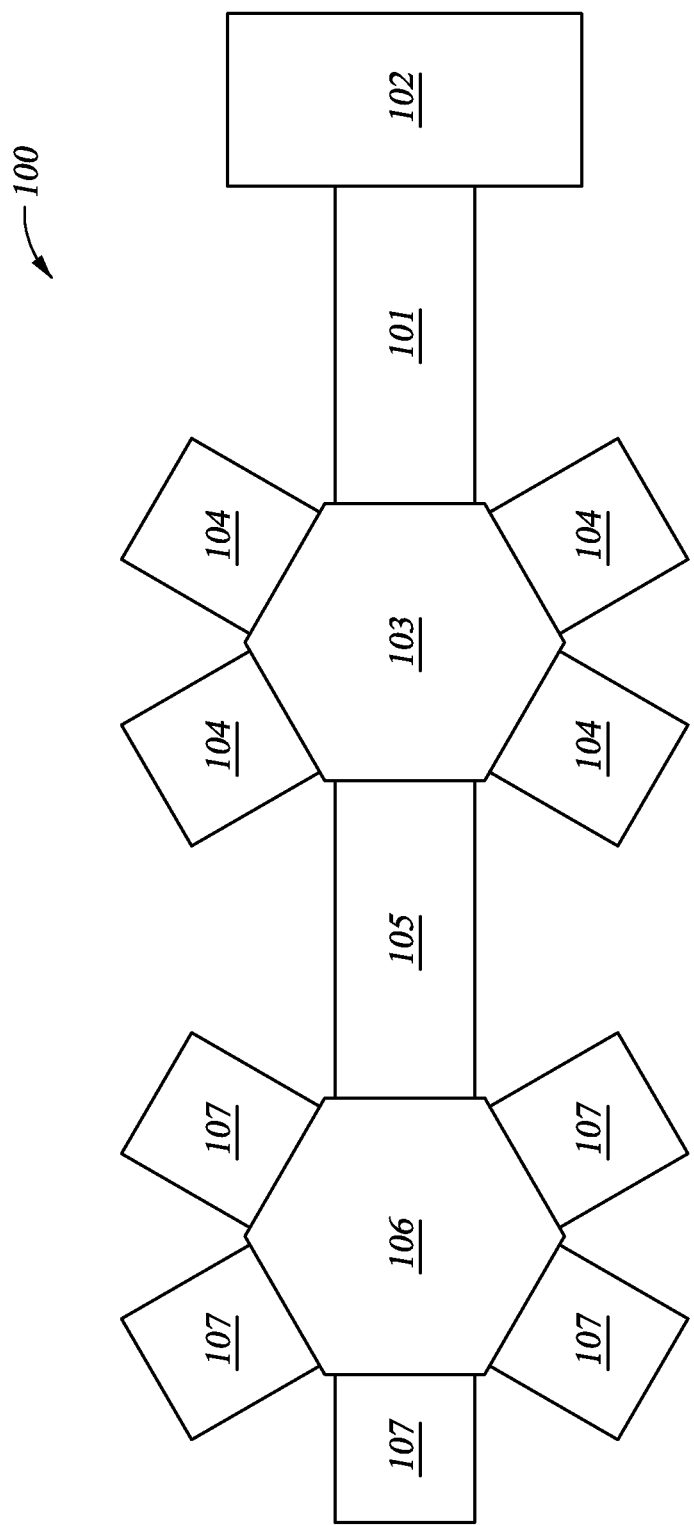
FIG. 1 is a schematic top view of a multi-cluster tool according to one embodiment.

FIG. 1 is a schematic, top view of a multi-cluster tool 100. The multi-cluster tool 100 comprises a first cluster having a first transfer chamber 103 surrounded by one or more processing chambers 104. A first load lock chamber 101 is coupled to the first transfer chamber 103. Additionally, the first load lock chamber 101 is coupled to a factory interface 102. A second cluster is also present that includes a second transfer chamber 106 having one or more processing chambers 107 coupled thereto. The second transfer chamber 106 is coupled to the first transfer chamber 103 by a second load lock chamber 105.

The first load lock chamber 101 is provided for transferring substrates between the first transfer chamber 103, which is typically at high vacuum, and a factory interface 102, typically at atmospheric pressure. In most cases, the substrate is a wafer or a glass substrate. The first transfer chamber 103 is provided with a vacuum transfer robot located therein for transferring substrates between the first load lock chamber 101 and the processing chambers 104/second load lock chamber 105, which are located about the periphery of the first transfer chamber 103.

The second load lock chamber 105 is provided for transferring substrates between the first transfer chamber 103 and the second transfer chamber 106, which is also typically at high vacuum. The second transfer chamber 106 is provided with a vacuum transfer robot located therein for transferring substrates between the second load lock chamber 105 and the processing chambers 107, which are located about the periphery of the second transfer chamber 106.

Figure 2:
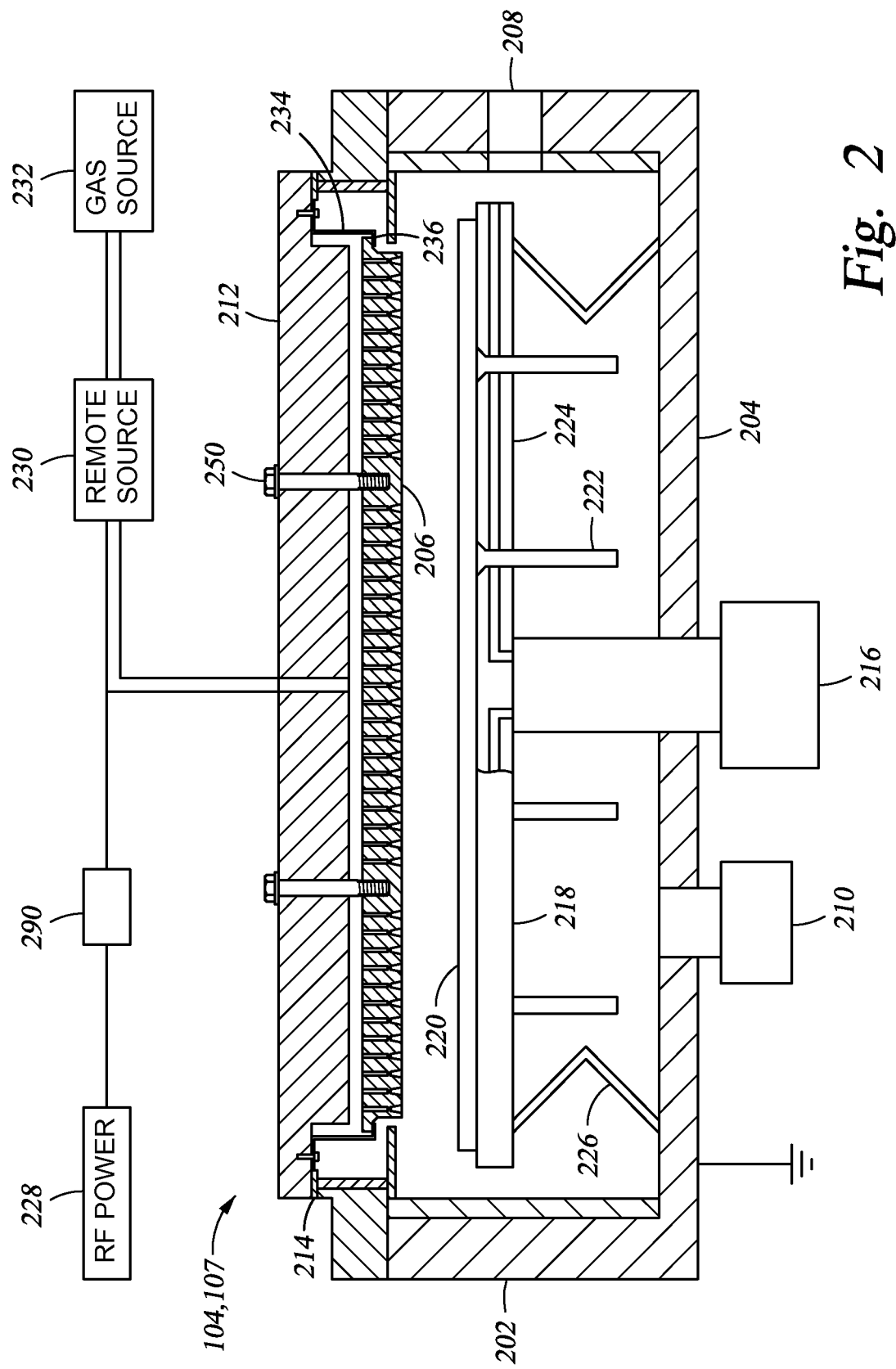
FIG. 2 is a schematic cross-section view of a PECVD chamber that may be utilized in the cluster tool of FIG. 1.

FIG. 2 is a schematic, cross sectional view of a PECVD apparatus that may be used as one of the processing chambers 104, 107. The apparatus includes a processing chamber 104, 107 in which one or more films may be deposited onto a substrate 220. The processing chamber 104, 107 generally includes walls 202, a bottom 204 and a showerhead 206 which define a process volume. A substrate support 218 is disposed within the process volume. The process volume is accessed through a slit valve opening 208 such that the substrate 220 may be transferred in and out of the processing chamber 104, 107. The substrate support 218 may be coupled to an actuator 216 to raise and lower the substrate support 218. Lift pins 222 are moveably disposed through the substrate support 218 to move a substrate to and from the substrate receiving surface. The substrate support 218 may also include heating and/or cooling elements 224 to maintain the substrate support 218 at a desired temperature. The substrate support 218 may also include RF return straps 226 to provide an RF return path at the periphery of the substrate support 218.

The showerhead 206 is coupled to a backing plate 212 by a fastening mechanism 250. The showerhead 206 may be coupled to the backing plate 212 by one or more fastening mechanisms 250 to help prevent sag and/or control the straightness/curvature of the showerhead 206.

A gas source 232 is coupled to the backing plate 212 to provide gas through gas passages in the showerhead 206 to a processing area between the showerhead 206 and the substrate 220. A vacuum pump 210 is coupled to the processing chamber 104, 107 to control the process volume at a desired pressure. An RF source 228 is coupled through a match network 290 to the backing plate 212 and/or to the showerhead 206 to provide an RF current to the showerhead 206. The RF current creates an electric field between the showerhead 206 and the substrate support 218 so that a plasma may be generated from the gases between the showerhead 206 and the substrate support 218.

A remote plasma source 230, such as an inductively coupled remote plasma source 230, may also be coupled between the gas source 232 and the backing plate 212. Between processing substrates, a cleaning gas may be provided to the remote plasma source 230 so that a remote plasma is generated. The radicals from the remote plasma may be provided to the processing chamber 104, 107 to clean processing chamber 104, 107 components. The cleaning gas may be further excited by the RF source 228 provided to the showerhead 206.

The showerhead 206 may additionally be coupled to the backing plate 212 by showerhead suspension 234. In one embodiment, the showerhead suspension 234 is a flexible metal skirt. The showerhead suspension 234 may have a lip 236 upon which the showerhead 206 may rest. The backing plate 212 may rest on an upper surface of a ledge 214 coupled with the walls 202 to seal the processing chamber 104, 107.

Figure 3:
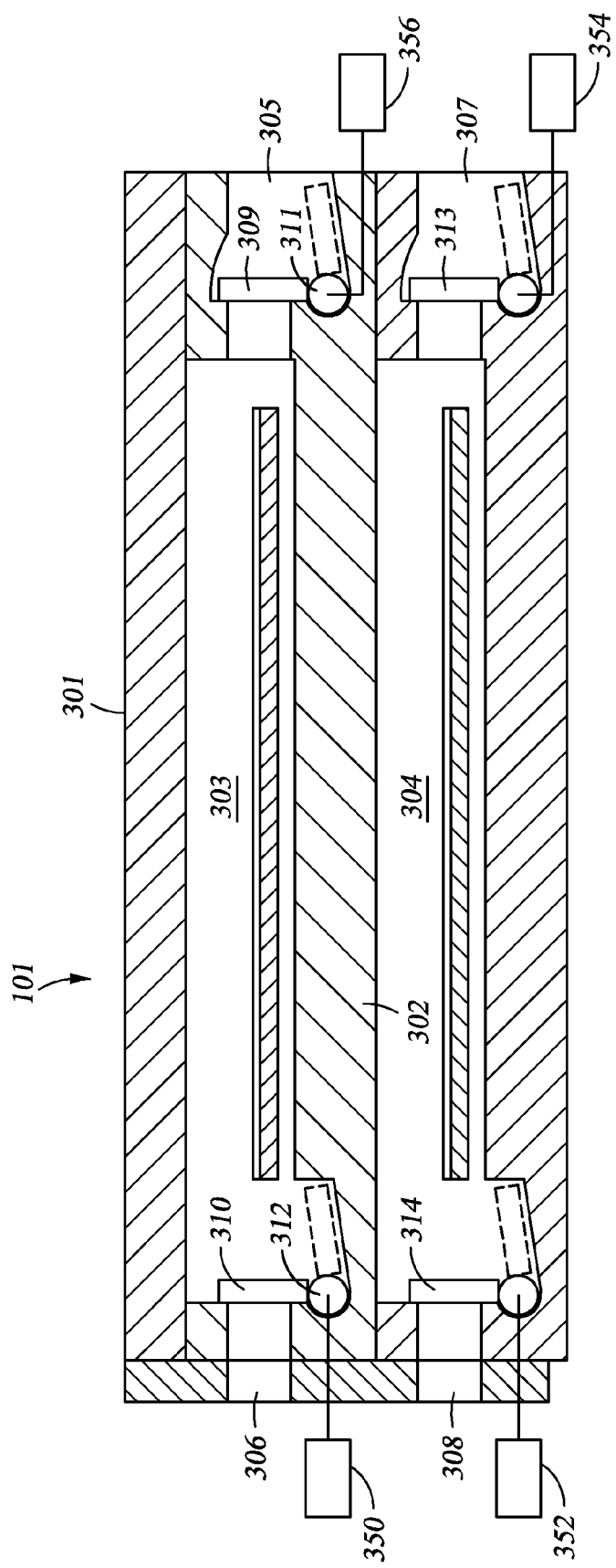
FIG. 3 is a schematic cross-section view of a load lock chamber according to one embodiment of the invention described herein.

FIG. 3 is a schematic, cross-section view of a load lock chamber 101 according to one embodiment of the invention. The load lock chamber 101 generally includes a chamber body 301 that includes a plurality of vertically-stacked, environmentally-isolated cavities that are separated by vacuum-tight, horizontal interior walls 302. Although two single cavities 303, 304 are shown in the embodiment depicted in FIG. 3, it is contemplated that the chamber body 301 of load lock chamber 101 may include two or more vertically-stacked cavities. For example, the load lock chamber 101 may include N cavities separated by N−1 horizontal interior walls 302, where N is an integer greater than one.

Each of the cavities 303, 304 defined in the chamber body 301 includes two substrate access ports. The ports are configured to facilitate the entry and egress of substrates from the load lock chamber 101. In the embodiment depicted in FIG. 3, the first cavity 303 disposed at the top of the chamber body 301 includes a first substrate access port 305 and a second substrate access port 306. The first substrate access port 305 is the access port through which the substrate passes when moving between the load lock chamber 101 and the factory interface 102. The second substrate access port 306 is the access port through which the substrate passes when moving between the load lock chamber 101 and the transfer chamber 103. The substrate access ports 305, 306 are disposed on opposite sides of the chamber body 301.

Each of the substrate access ports 305, 306 is selectively sealed by respective slit valve doors 309, 310 adapted to selectively isolate the first cavity 303 from the environment of the transfer chamber 103 and the factory interface 102. The slit valve doors 309, 310 are moved between an open and closed position by pivoting about an axis 311, 312. The slit valve doors are actuated by respective actuators 350, 356. Each of the slit valve doors 309, 310 is pivotally coupled to the chamber body 301 along a first edge and rotated between the open and closed position by the actuators 350, 356.

The first slit valve door 309, which is the door between the first load lock chamber 101 and the factory interface 102, seals the first substrate access port 305 from the exterior side of the chamber body 301. The first slit valve door 309 is coupled to the first load lock chamber 101 as shown in FIG. 3. The actuator 356 opens the first slit valve door 309 by rotating the first slit valve door 309 about axis 311 towards the outside surface of the cavity 303. When the first slit valve door 309 is opened, cavity 303 is at atmospheric pressure, just as the factory interface 102. However, once the first slit valve door 309 closes, the cavity 303 is evacuated so that the cavity reaches a high vacuum that substantially matches the vacuum level of the first transfer chamber 103 so that the second slit valve door 310 can open. The vacuum level in the cavity 303 will pull the first slit valve door 309 against the sealing surface. Additionally, the atmospheric pressure of the factory interface 102 will push the first slit valve door 309 against the sealing surface. Thus, the first slit valve door 309 will seal effectively. If the first slit valve door 309 were reversed such that the seal was against the inside surface of the cavity 303, the atmospheric pressure of the factory interface 102, together with the vacuum level within the cavity 303, would pull/push the door from the sealing surface and thus result in leaks and a poor vacuum seal.

The second slit valve door 310 operates opposite to the first slit valve door 309. Specifically, the second slit valve door 310 is positioned within the chamber body 301. The actuator 350 opens the second slit valve door 310 by rotating the second slit valve door 310 about axis 312 towards the inside surface of the cavity 303. When the second slit valve door 310 is opened, cavity 303 is at a high vacuum pressure, just as the first transfer chamber 103. However, once the second slit valve door 310 closes, the cavity 303 can be vented to atmosphere so that the cavity 303 substantially matches the vacuum level of the factory interface 102 so that the first slit valve door 309 can open. The vacuum level in the first transfer chamber 103 will pull the second slit valve door 310 against the inside sealing surface. Additionally, the atmospheric pressure of the cavity 303, once vented, will push the second slit valve door 310 against the sealing surface. Thus, the second slit valve door 310 will seal effectively. If the first slit valve door 309 were reversed such that the seal was against the outside surface of the cavity 303, the atmospheric pressure of the cavity 303, together with the vacuum level within the first transfer chamber 103, would pull/push the door from the sealing surface and thus result in leaks and a poor vacuum seal. The second cavity 304 is similarly configured with access ports 307, 308, actuators 352, 354 and slit valve doors 313, 314.

Figure 4:
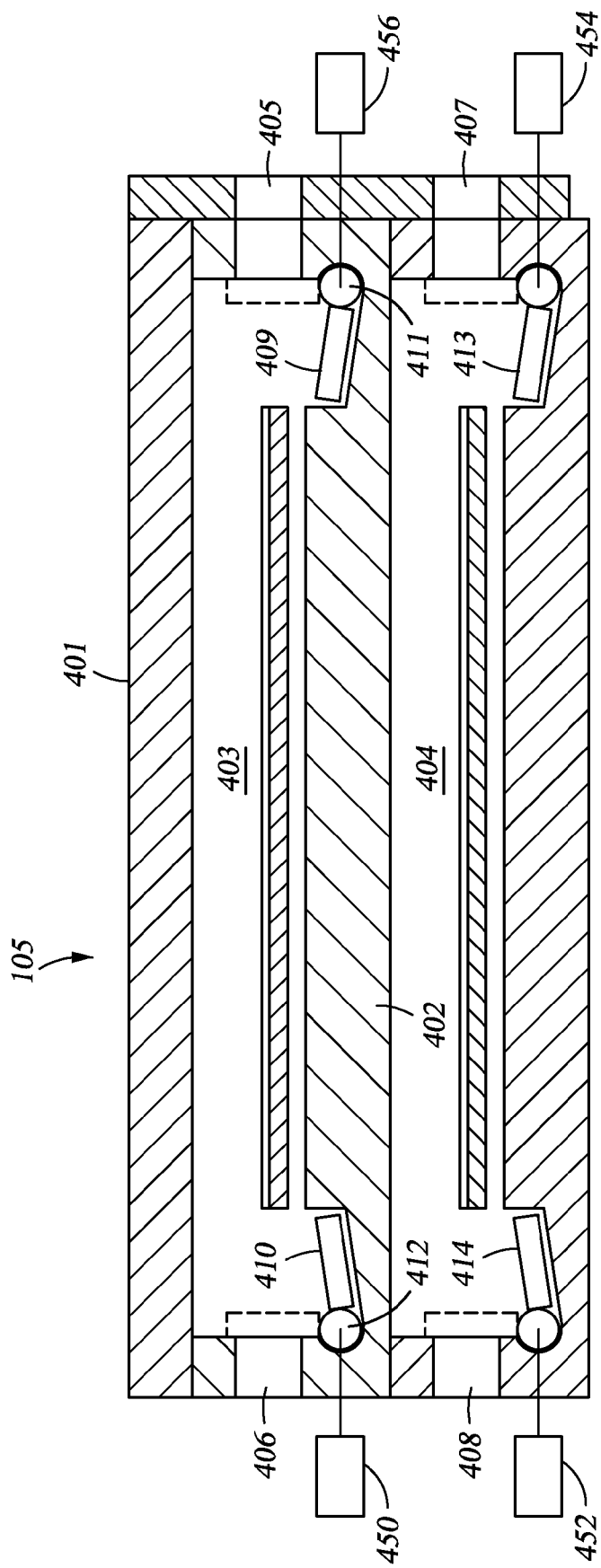
FIG. 4 is a schematic cross-section view of a load lock chamber according to one embodiment of the invention described herein.

FIG. 4 is a schematic, cross-section view of the second load lock chamber 105 according to one embodiment of the invention. A load lock chamber generally includes a chamber body 401 that includes a plurality of vertically-stacked, environmentally-isolated cavities 403, 404 that are separated by vacuum-tight, horizontal interior wall 402. Although two single cavities 403, 404 are shown in the embodiment depicted in FIG. 4, it is contemplated that the chamber body 401 of the second load lock chamber 105 may include two or more vertically-stacked cavities. For example, the second load lock chamber 105 may include N cavities separated by N−1 horizontal interior walls 402, where N is an integer greater than one.

Each of the cavities 403, 404 defined in the chamber body 401 includes two substrate access ports 405, 406, 407, 408. The ports 405, 406, 407, 408 are configured to facilitate the entry and egress of substrates from the second load lock chamber 105. In the embodiment depicted in FIG. 4, the first cavity 403 disposed at the top of the chamber body 401 includes a first substrate access port 405 and a second substrate access port 406. The first substrate access port 405 is the access port through which the substrate passes when moving between the second load lock chamber 105 and the first transfer chamber 103. The second substrate access port 406 is the access port through which the substrate passes when moving between the second load lock chamber 105 and the second transfer chamber 106. The substrate access ports 405, 406 are disposed on opposite sides of the chamber body 401.

Each of the substrate access ports 405, 406 is selectively sealed by respective slit valve doors 409, 410 adapted to selectively isolate the first cavity 403 from the environment of the first transfer chamber 103 and the second transfer chamber 106. The slit valve doors 409, 410 are moved between an open and closed position by pivoting about an axis 411, 412. The slit valve doors are actuated by respective actuators 450, 456. Each of the slit valve doors 409, 410 is pivotally coupled to the chamber body 401 along a first edge and rotated between the open and closed position by the actuators 450, 456.

The first slit valve door 409 is positioned within the chamber body 401. The actuator 456 opens the first slit valve door 409 by rotating the first slit valve door 409 about axis 411 towards the inside surface of the cavity 403. When the first slit valve door 409 is opened, cavity 403 is at a high vacuum pressure, just as the first transfer chamber 103. However, once the first slit valve door 409 closes, the cavity 403 can be vented to atmosphere so that the second load lock chamber 105 may be serviced. The atmospheric pressure within the cavity 403 during servicing, together with the high vacuum level of the first transfer chamber 103 will push/pull the first slit valve door 409 against the sealing surface to ensure a good seal. During processing, the vacuum level within the first and second transfer chambers 103, 106 will substantially match the vacuum level of the second load lock chamber 105 and thus, a good seal should be present.

The second slit valve door 410 operates in the same manner as the first slit valve door 409. Specifically, the second slit valve door 410 is positioned within the chamber body 401. The actuator 450 opens the second slit valve door 410 by rotating the second slit valve door 410 about axis 412 towards the inside surface of the cavity 403. When the second slit valve door 410 is opened, cavity 403 is at a high vacuum pressure, just as the second transfer chamber 106. However, once the second slit valve door 410 closes, the cavity 403 can be vented to atmosphere so that the second load lock chamber 105 may be serviced. The atmospheric pressure within the cavity 403 during servicing, together with the high vacuum level of the second transfer chamber 106 will push/pull the second slit valve door 410 against the sealing surface to ensure a good seal. During processing, the vacuum level within the first and second transfer chambers 103, 106 will substantially match the vacuum level of the second load lock chamber 105 and thus, a good seal should be present. The second cavity 404 is similarly configured with access ports 407, 408, actuators 452, 454 and slit valve doors 413, 414.

By sealing a load lock chamber properly, the vacuum levels of the adjacent chambers can assist, rather than prevent, a good seal so that few, if any leaks are present.

While the foregoing is directed to embodiments of the present invention, other and further embodiments of the invention may be devised without departing from the basic scope thereof, and the scope thereof is determined by the claims that follow.

The invention claimed is:

1. An apparatus for forming a device, comprising:
   a first transfer chamber;
   a first load lock chamber, comprising:
      a chamber body enclosing a cavity, and having a first end adapted for coupling to a factory interface and a second end adapted for coupling to the first transfer chamber;
      a first slit valve door for sealing the first end, the first slit valve movable to seal the first end from outside of the cavity; and
      a second slit valve door for sealing the second end, the second slit valve movable to seal the second end from inside the cavity; and
   a plurality of processing chambers coupled to the first transfer chamber.

2. An apparatus for forming a device, comprising:
   a first transfer chamber;
   a first load lock chamber, comprising:
      a chamber body enclosing a cavity, and having a first end adapted for coupling to a factory interface and a second end adapted for coupling to the first transfer chamber;
      a first slit valve door for sealing the first end, the first slit valve movable to seal the first end from outside of the cavity; and
      a second slit valve door for sealing the second end, the second slit valve movable to seal the second end from inside the cavity;
   a plurality of processing chambers coupled to the first transfer chamber;
   a second transfer chamber;
   a second load lock chamber coupled to the first transfer chamber, the second load lock chamber comprising:
      a second chamber body having a third end adapted for coupling to the first transfer chamber and a fourth end adapted for coupling to a second transfer chamber;
      a third slit valve door for sealing the third end, the third slit valve door movable to seal the third end from inside the second chamber body; and
      a fourth slit valve door for sealing the fourth end, the fourth slit valve door movable to seal the fourth end from inside the second chamber body; and
   a plurality of processing chambers coupled to the second transfer chamber.

3. The apparatus of claim 2, wherein the first load lock chamber further comprises:
   a first actuator coupled to the first slit valve door, wherein the first actuator opens the first slit valve door towards the outside of the chamber body; and
   a second actuator coupled to the second slit valve door, wherein the second actuator opens the second slit valve door towards the inside of the cavity.

4. The apparatus of claim 3, wherein the second load lock chamber further comprises:
   a third actuator coupled to the third slit valve door, wherein the third actuator opens the third slit valve door towards the inside of the second chamber body; and
   a fourth actuator coupled to the fourth slit valve door, wherein the fourth actuator opens the fourth slit valve door towards the inside of the second chamber body.

5. The apparatus of claim 4, wherein the first slit valve door is disposed outside the cavity below a substrate transfer plane.

6. The apparatus of claim 5, wherein the second slit valve door is disposed inside the cavity below the substrate transfer plane.

7. The apparatus of claim 6, wherein the third slit valve door is disposed inside the chamber body below a substrate transfer plane.

8. The apparatus of claim 7, wherein the fourth slit valve door is disposed inside the chamber body below a substrate transfer plane.

9. A load lock chamber, comprising:
   a chamber body having a first side adapted for coupling to a factory interface and a second side adapted for coupling to a transfer chamber;
   a first slit valve door disposed inside the chamber body at the first side below a substrate transfer plane;
   a second slit valve door disposed inside the chamber body at the second side below the substrate transfer plane;
   a first actuator coupled to the first slit valve door, wherein the first actuator opens the first slit valve door towards the outside of the chamber body; and
   a second actuator coupled to the second slit valve, wherein the second actuator opens the second slit valve door towards the inside of the chamber body.

10. A load lock chamber, comprising:
    a chamber body having a first side adapted for coupling to a first transfer chamber and a second side adapted for coupling to a second transfer chamber;
    a first slit valve door disposed inside the chamber body at the first side below a substrate transfer plane;
    a second slit valve door disposed inside the chamber body at the second side below the substrate transfer plane;
    a first actuator coupled to the first slit valve door, wherein the first actuator opens the first slit valve door towards the inside of the chamber body; and
    a second actuator coupled to the second slit valve, wherein the second actuator opens the second slit valve door towards the inside of the chamber body.

11. A method of processing substrates in the apparatus of claim 1, comprising the steps of:
    loading substrates from a factory interface to a first load lock chamber through a first slit valve door disposed inside the first load lock chamber, wherein the first slit valve door opens toward an outside surface of the first load lock chamber;
    transferring substrates from the first load lock chamber to a first transfer chamber through a second slit valve door disposed inside the first load lock chamber, wherein the second slit valve door opens toward an inside surface of the first load lock chamber;

transferring substrates from the first transfer chamber to processing chambers coupled to the first transfer chamber;

processing substrates in the processing chambers;

transferring substrates to the first transfer chamber after processing;

transferring substrates from the first transfer chamber to a second load lock chamber through a third slit valve door disposed inside the second load lock chamber, wherein the third slit valve door opens toward the inside of the second load lock chamber; and transferring substrates from the second load lock chamber to a second transfer chamber through a fourth slit valve door disposed inside the second load lock chamber, wherein the fourth slit valve door opens toward the inside of the second load lock chamber.

12. The method of claim 11, wherein the substrate is a wafer or a glass substrate.

13. The method of claim 12, wherein the first transfer chamber operates under vacuum condition.

14. The method of claim 13, wherein the second load lock chamber operates under vacuum condition.

15. The method of claim 14, wherein the second transfer chamber operates under vacuum condition.

* * * * *